(12) United States Patent
Kim et al.

(10) Patent No.: US 9,028,613 B2
(45) Date of Patent: May 12, 2015

(54) ROTATING TYPE THIN FILM DEPOSITION APPARATUS AND THIN FILM DEPOSITION METHOD USED BY THE SAME

(75) Inventors: Jin-Kwang Kim, Yongin (KR); Sang-Joon Seo, Yongin (KR); Seung-Hun Kim, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 183 days.

(21) Appl. No.: 13/443,268

(22) Filed: Apr. 10, 2012

(65) Prior Publication Data
US 2013/0115373 A1 May 9, 2013

(30) Foreign Application Priority Data
Nov. 3, 2011 (KR) .................. 10-2011-0114126

(51) Int. Cl.
| | |
|---|---|
| *C23C 16/458* | (2006.01) |
| *C23C 14/50* | (2006.01) |
| *B01J 19/18* | (2006.01) |
| *B01J 19/22* | (2006.01) |
| *C23C 16/455* | (2006.01) |

(52) U.S. Cl.
CPC ........... *C23C 16/458* (2013.01); *B01J 19/1887* (2013.01); *B01J 19/22* (2013.01); *C23C 14/50* (2013.01); *C23C 16/45551* (2013.01)

(58) Field of Classification Search
USPC ......... 118/719, 729, 209, 239, 715, 718, 728; 156/345.1, 345.54, 345.31, 345.51; 198/803.14, 837, 841, 860.1, 867.11; 414/222.11, 331.01, 331.02, 331.03, 414/331.04, 331.05, 331.06, 331.07, 414/331.08, 331.09, 331.1, 331.11, 331.12, 414/331.13, 331.14, 331.15, 331.16, 414/331.17, 331.18; 427/248.1, 251, 255.5, 427/424; 65/118
See application file for complete search history.

(56) References Cited

U.S. PATENT DOCUMENTS

| | | | | |
|---|---|---|---|---|
| 1,963,314 | A | * | 6/1934 | Savell et al. .................. 198/797 |
| 2,097,885 | A | * | 11/1937 | Koppe .......................... 118/719 |
| 2,339,494 | A | * | 1/1944 | Lubahn ........................ 198/798 |
| 2,386,567 | A | * | 10/1945 | Olson ........................... 269/228 |
| 2,880,850 | A | * | 4/1959 | Keathley, Sr. et al. ... 198/803.11 |
| 2,893,538 | A | * | 7/1959 | Buttironi et al. ............. 198/795 |

(Continued)

FOREIGN PATENT DOCUMENTS

| | | | |
|---|---|---|---|
| DE | 10131232 C1 | * | 9/2002 |
| JP | 61019117 A | * | 1/1986 |

(Continued)

*Primary Examiner* — Parviz Hassanzadeh
*Assistant Examiner* — Stanislav Antolin
(74) *Attorney, Agent, or Firm* — Robert E. Bushnell, Esq.

(57) ABSTRACT

A rotating type thin film deposition apparatus having an improved structure that allows continuous deposition, and a thin film deposition method used by the rotating type thin film deposition apparatus are provided. The rotating type thin film deposition apparatus includes a deposition device; a circulation running unit that runs a deposition target on a circulation track via a deposition region of the deposition device; and a support unit that supports the deposition target and moves along the circulation track. Thin layers can be precisely and uniformly formed on the entire surface of a deposition target, and since deposition is performed while a plurality of deposition targets move along a caterpillar track, a working speed is faster compared to a method involving a general reciprocating motion, and the size of the thin film deposition apparatus can be reduced.

14 Claims, 5 Drawing Sheets

(56) References Cited

U.S. PATENT DOCUMENTS

| | | | | |
|---|---|---|---|---|
| 2,962,984 A | * | 12/1960 | Noel | 198/402 |
| 3,034,665 A | * | 5/1962 | Speaker | 198/349.6 |
| 3,086,638 A | * | 4/1963 | Keesling | 198/386 |
| 3,122,235 A | * | 2/1964 | Meeker et al. | 198/794 |
| 3,132,966 A | * | 5/1964 | Hughes et al. | 427/498 |
| 3,239,316 A | * | 3/1966 | Yamashita et al. | 422/198 |
| 3,282,273 A | * | 11/1966 | Johnston et al. | 134/102.1 |
| 3,316,813 A | * | 5/1967 | Wenig | 409/262 |
| 3,476,231 A | * | 11/1969 | Bower | 198/345.2 |
| 3,511,703 A | * | 5/1970 | Peterson | 438/778 |
| 3,673,981 A | * | 7/1972 | Beckham et al. | 118/719 |
| 3,912,467 A | * | 10/1975 | Trump et al. | 96/94 |
| 4,113,082 A | * | 9/1978 | Timin | 118/729 |
| 4,407,493 A | * | 10/1983 | Okolischan | 269/93 |
| 4,440,552 A | * | 4/1984 | Uchiya et al. | 96/40 |
| 4,710,428 A | * | 12/1987 | Tamamizu et al. | 118/725 |
| 4,807,561 A | * | 2/1989 | Ebata | 118/729 |
| 4,843,764 A | * | 7/1989 | Bando | 451/260 |
| 5,170,714 A | * | 12/1992 | Katagiri | 104/282 |
| 5,564,556 A | * | 10/1996 | Spada et al. | 198/803.13 |
| 5,618,388 A | * | 4/1997 | Seeser et al. | 204/192.12 |
| 5,714,009 A | * | 2/1998 | Boling | 118/723 MW |
| 5,830,253 A | * | 11/1998 | Kuster et al. | 65/273 |
| 5,878,866 A | * | 3/1999 | Lisec | 198/496 |
| 6,321,904 B1 | * | 11/2001 | Mitchell | 198/867.11 |
| 6,485,616 B1 | * | 11/2002 | Howard et al. | 204/192.12 |
| 6,533,106 B1 | * | 3/2003 | Lykkegaard | 198/800 |
| 6,595,507 B2 | * | 7/2003 | Dykstra | 269/228 |
| 7,604,448 B2 | * | 10/2009 | Balk et al. | 414/331.03 |
| 2004/0065255 A1 | * | 4/2004 | Yang et al. | 118/715 |
| 2004/0067641 A1 | * | 4/2004 | Yudovsky | 438/680 |
| 2006/0096844 A1 | * | 5/2006 | Jones | 198/841 |
| 2006/0260914 A1 | * | 11/2006 | Krause et al. | 198/817 |
| 2007/0267799 A1 | * | 11/2007 | Dykstra | 269/228 |
| 2009/0065328 A1 | * | 3/2009 | Gonzalez Alemany et al. | 198/326 |
| 2009/0304924 A1 | * | 12/2009 | Gadgil | 118/718 |
| 2009/0324813 A1 | * | 12/2009 | Ueno | 118/500 |

FOREIGN PATENT DOCUMENTS

| | | | |
|---|---|---|---|
| KR | 10-1999-0048486 | | 7/1999 |
| KR | 10-2001-0017036 | | 3/2001 |
| KR | 20010017036 A | * | 3/2001 |
| KR | 10-2010-0072463 | | 7/2010 |
| NL | 2001910 C | * | 3/2010 |

* cited by examiner

ROTATING TYPE THIN FILM DEPOSITION APPARATUS AND THIN FILM DEPOSITION METHOD USED BY THE SAME

CLAIM OF PRIORITY

This application makes reference to, incorporates the same herein, and claims all benefits accruing under 35 U.S.C. §119 from an application earlier filed in the Korean Intellectual Property Office on 3 Nov. 2011 and there duly assigned Serial No. 10-2011-0114126.

BACKGROUND OF THE INVENTION

1. Field of the Invention

One or more embodiments of the present invention relate to a thin film deposition apparatus, in which vapor generated in a deposition source is deposited on the surface of a deposition target, and more particularly, to a rotating type thin film deposition apparatus having an improved structure that allows continuous deposition, and a thin film deposition method used by the rotating type thin film deposition apparatus.

2. Description of the Related Art

A deposition process whereby vapor generated in a deposition source is deposited on the surface of a deposition target, such as a substrate, is widely used in a thin film manufacturing process, such as a thin film transistor manufacturing process of an organic light-emitting display apparatus.

An atomic layer deposition (ALD) process, whereby a thin film may be more uniformly and precisely formed, has been recently preferred. In such an ALD process, deposition is repeatedly performed at the same position of the deposition target more than 300 times.

When deposition needs to be performed on a deposition target several times, like in the ALD process, deposition is performed repeatedly while moving the deposition target relative to a deposition device in a reciprocating manner.

However, when deposition is performed while the deposition target is moved relative to the deposition device in a reciprocating manner, an acceleration and deceleration period is continuously generated whenever the direction of movement of the deposition target is changed. Thus, it is not easy to maintain uniform process conditions. That is, when the deposition target is moved relative to the deposition device only at a constant speed, the instants of time when the deposition target faces the deposition device are all the same, and thus, uniform deposition may be performed. However, during an acceleration and deceleration period, the instants of time when the deposition target faces the deposition device are different in every period, and thus, it is difficult to ensure uniform deposition.

In addition, in a method whereby the deposition target is moved relative to the deposition device in a reciprocating manner, since deposition on the deposition target is completed and then deposition on the next deposition target can be performed, a working speed is very slow. In order to solve this problem, if a plurality of deposition targets are arranged in one line and are simultaneously moved relative to the deposition device in a reciprocating manner, a space in which all the plurality of deposition targets are moved relative to the deposition device needs to be formed. Thus, the size of the deposition device needs to be considerably large.

Thus, a new type of deposition method for addressing these disadvantages is required.

SUMMARY OF THE INVENTION

One or more embodiments of the present invention provide a thin film deposition apparatus of a rotating type, the thin film deposition apparatus having an improved structure that allows continuous deposition to be performed on a deposition target without generating acceleration and deceleration periods, and a thin film deposition method used by the thin film deposition apparatus.

According to an aspect of the present invention, there is provided a thin film deposition apparatus including: a deposition device; a circulation running unit that runs a deposition target on a circulation track via a deposition region of the deposition device; and a support unit that supports the deposition target and moves along the circulation track.

The circulation running unit may include: a driving pulley that is rotated by a motor and a driven pulley that is spaced apart from the driving pulley; and a circulation belt coupling the driving pulley to the driven pulley. The circulation belt defines the circulation track, and runs along the circulation track.

The support unit may include: a connection bar that is connected to the circulation belt; a support plate that is connected to the connection bar so that the deposition target is mounted on the support plate; and a clamping mechanism that fixes the deposition target to the support plate.

The clamping mechanism may include: a clamper that is rotatably installed on the support plate; and an actuator that rotates and drives the clamper so that the clamper presses the deposition target towards the support plate to fix the deposition target to the support plate.

A length of the support plate in a proceeding direction of the support plate may be the same as circumferential lengths of the driving pulley and the driven pulley.

Five support plates may be connected to the circulation belt.

The thin film deposition apparatus may further include a guide unit that prevents fluctuation of the deposition target while the support unit moves.

The guide unit may include: a guide rail that is disposed along the circulation track; and a plurality of guide protrusions that are disposed on the support unit so as to be combined with the guide rail.

The deposition target may be laid in a horizontal direction and may run on the circulation track.

The deposition target may be laid in a vertical direction and may run on the circulation track.

A pair of deposition devices may be disposed at both sides of the circulation running unit.

According to another aspect of the present invention, there is provided a thin film deposition method including: forming a circulation track via a deposition region of a deposition device; loading a deposition target on a support plate that is capable of moving along the circulation track; circulating the deposition target along the circulation track so that deposition is performed in the deposition region; and unloading the deposition target after deposition is completed, from the support plate.

The circulation track may be disposed in such a way that the deposition target is laid in a horizontal direction and runs on the circulation track.

The circulation track may be disposed in such a way that the deposition target is laid in a vertical direction and runs on the circulation track.

Loading and unloading of the deposition target may be performed at a position, at which a proceeding direction of the support plate is changed into an opposite direction along the circulation track.

A pair of deposition devices may be disposed at both sides of the circulation track.

In the thin film deposition apparatus and method according to the present invention, since the deposition target is moved relative to the deposition device only at a constant speed while deposition is performed, thin layers can be precisely and uniformly formed on the entire surface of the deposition target, and since deposition is performed while a plurality of deposition targets move along a caterpillar track, a working speed is faster compared to a general reciprocating motion method, and the size of the thin film deposition apparatus can be reduced.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more fully with reference to the accompanying drawings, in which exemplary embodiments of the invention are shown.

First, a thin film deposition apparatus according to an embodiment of the present invention will be described.

Figure 1:
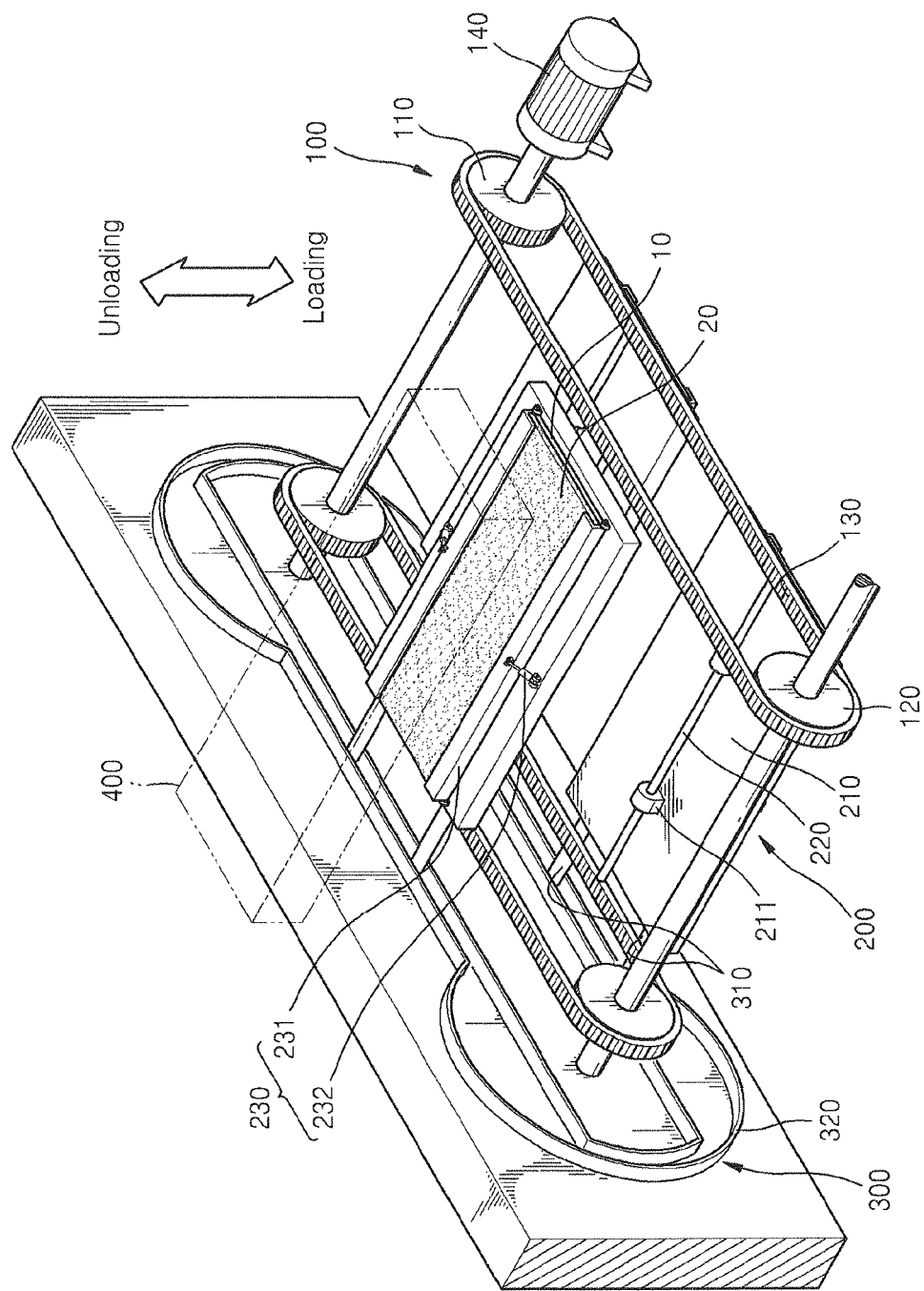
FIG. 1 is a perspective view of a structure of a thin film deposition apparatus according to an embodiment of the present invention.

The thin film deposition apparatus illustrated in FIG. 1 includes a deposition device 400 that generates vapor in a deposition source, a circulation running unit 100 that runs on a circulation track via a deposition region (see D of FIG. 5) of the deposition device 400, and a support unit 200 that supports a substrate 10 as a deposition target together with a mask 20 and is moved along the circulation track. Thus, the substrate 10 is circulated on the circulation track along the circulation running unit 100 while being supported by the support unit 200, and deposition is performed by the deposition device 400 when the substrate 10 passes through the deposition region of the deposition device 400 on the circulation track. In this way, since the substrate 10 proceeds continuously along the circulation track at a constant speed, continuous deposition may be performed without generating acceleration and deceleration periods, regardless of the number of times of the deposition is repeated, and thus, a stable and uniform deposition may be ensured. Reference numeral 300 denotes a guide unit. The guide unit 300 guides a support plate 210 of the support unit 200 to be stably moved along the circulation track.

Hereinafter, a detailed structure of each element of the thin film deposition apparatus illustrated in FIG. 1 will be described.

The circulation running unit 100 includes a driving pulley 110 that is rotated by a motor 140 and a driven pulley 120 that corresponds to the driving pulley 110, and a circulation belt 130 that wraps the driving pulley 110 and the driven pulley 120. Thus, when the circulation running unit 100 is driven by the motor 140, the driving pulley 110 is rotated to run the circulation belt 130, and the rotating motion of the driving pulley 110 is transferred to the driven pulley 120 through the circulation belt 130. In other words, the circulation belt 130 couples the driving pulley 110 to the driven pulley 120. The circulation belt 130 forms a circulation track via the deposition region (see D of FIG. 5) of the deposition device 400 and runs on the circulation track. The circulation belt 130 may be a chain, a timing belt, or the like.

The support unit 200 includes a connection bar 220 that is connected to the circulation belt 130, a support plate 210 that is connected to the connection bar 220 via a link 211 so that the substrate 10 and the mask 20 are each mounted on the support plate 210, and a clamping mechanism 230 that fixes the substrate 10 and the mask 20 mounted on the support plate 210. Thus, when the substrate 10 that is a deposition target and the mask 20 are mounted on the support plate 210 and are fixed by the clamping mechanism 230, the deposition target is securely fixed on the support plate 210, and when the circulation belt 130 runs in this state, the support plate 210 that is connected to the connection bar 220 via the link 211 repeatedly passes through the deposition region of the deposition device 400 while being circulated along the circulation track.

Figure 2:
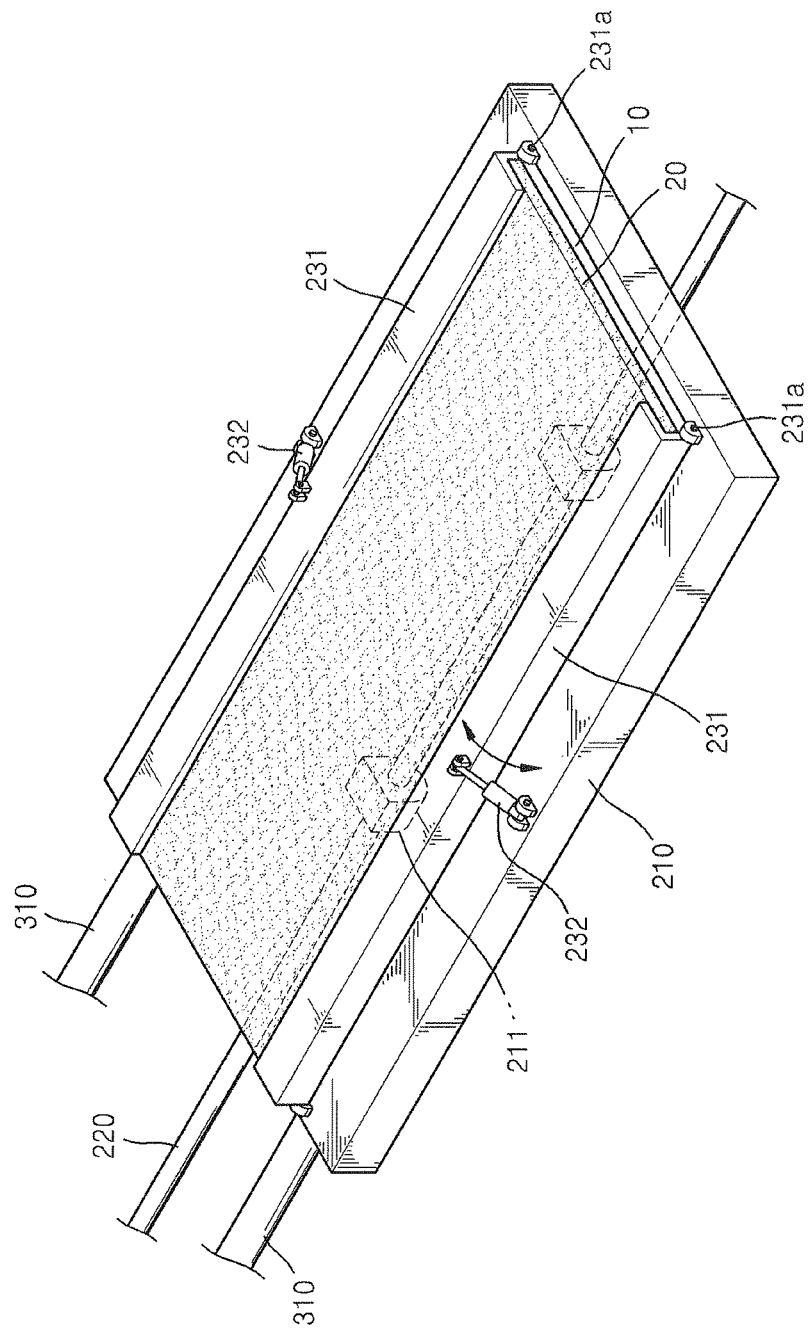
FIG. 2 is an enlarged perspective view of a support unit of the thin film deposition apparatus illustrated in FIG. 1.

The clamping mechanism 230 includes a clamper 231 that is rotatably installed on the support plate 210, and an actuator 232 that rotates and drives the clamper 231 so that the clamper 231 presses the substrate 10 as the deposition target and the mask 20 towards the support plate 210 in order to fix them, as illustrated in FIG. 2. Thus, when the actuator 232 operates, the clamper 231 is rotated and presses edges of the substrate 10 and the mask 20 to securely fix the substrate 10 and the mask 20 on the support plate 210.

According to this rotating type continuous deposition structure, the deposition target in particular may be severely shaken while passing through the driving pulley 110 and the driven pulley 120 and a proceeding direction of the deposition target is changed into an opposite direction. In this case, a problem may occur with regard to stable running. Thus, the guide unit 300 for ensuring stable running of the deposition target is additionally provided in the current embodiment.

Figure 3:
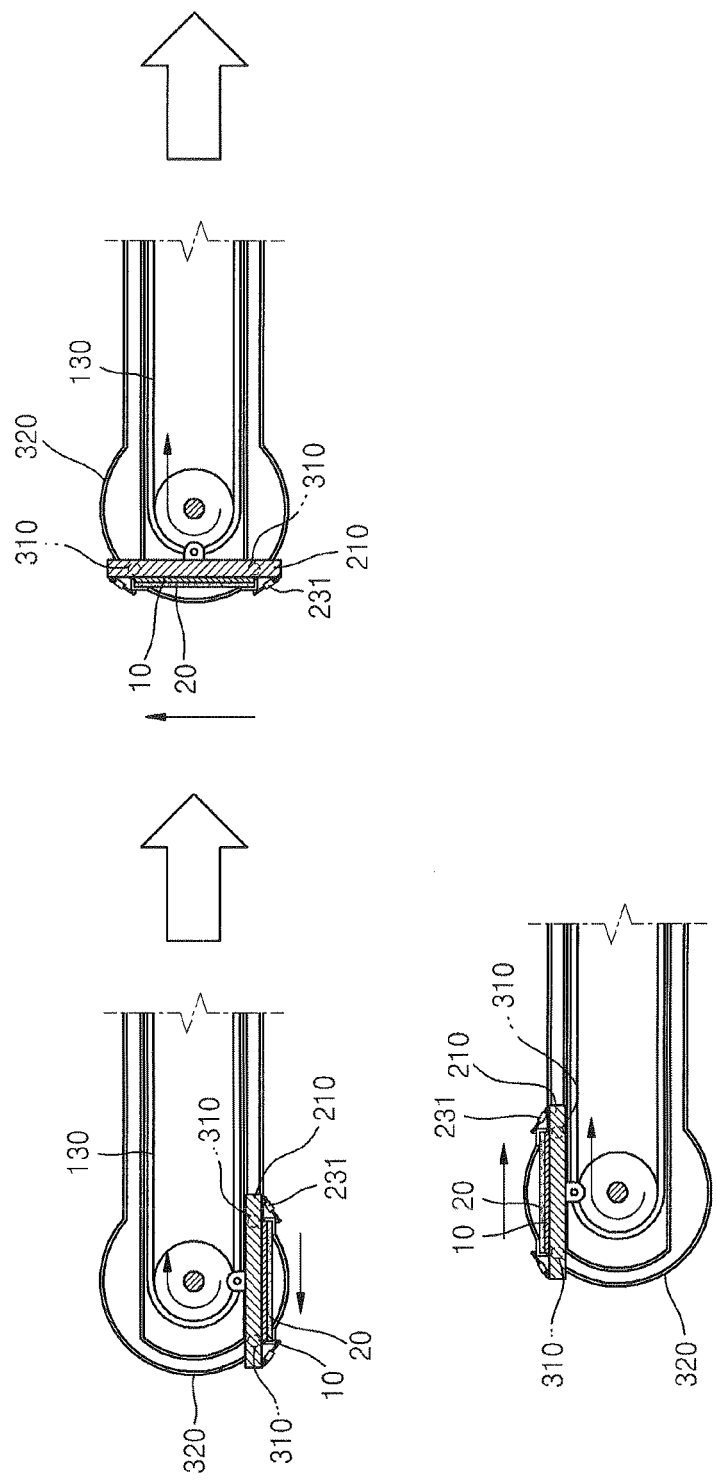
FIG. 3 illustrates an operation of moving a deposition target of the thin film deposition apparatus illustrated in FIG. 1.

The guide unit 300 includes a guide rail 320 that is arranged along the circulation track, and a plurality of guide protrusions 310 that are disposed on the support plate 210 so as to be combined with the guide rail 320. In this case, while the support plate 210 runs on the circulation track, the guide protrusion 310 is inserted in the guide rail 320 and is moved with the guide rail 320. Thus, stable running without shake may be ensured. In particular, the guide protrusion 310 prevents fluctuation of the deposition target while riding the guide rail 320 at a direction change point where a large fluctuation is expected, i.e., at a point where the support plate 210 turns in the opposite direction after passing through the driving pulley 110 and the driven pulley 120, as illustrated in FIG. 3. Thus, stable running without shake may be performed.

The thin film deposition apparatus having the above structure may operate as follows.

First, the substrate 10 and the mask 20 are loaded on the support plate 210 of the support unit 200 in order to perform a deposition process. Loading and unloading of the substrate 10 is performed on an end portion of the circulation track, i.e., at a change point where the proceeding direction of the support plate 210 starts to be changed into the opposite direction, as indicated in FIG. 1, because the point is a position suitable for loading and unloading operations of the substrate 10 without any interruption of a peripheral device, such as the deposition device 400. The loading and unloading operations of the substrate 10 may be performed manually or using an automatic loading mechanism including a generally-known robot arm, etc.

After the substrate 10 is loaded on the support plate 210 connected to the circulation belt 130, the deposition process starts to be performed by actuating the motor 140 and the deposition device 400. That is, when the motor 140 is actuated, the circulation belt 130 starts running on the circulation track. Thus, the substrate 10 and the mask 20 that are mounted on the support plate 210 repeatedly pass through the deposition region in a lower portion of the deposition device 400. While the substrate 10 and the mask 20 pass through the deposition region, vapor that is generated in a deposition source in the deposition device 400 is deposited on the substrate 10 via the mask 20. In an atomic layer deposition (ALD) process that has been recently used, deposition needs to be performed at the same position of the deposition target several hundreds of times. In this structure, when the support plate 210 is continuously moves along the circulation track, repetitive deposition is simply performed. Thus, repetitive deposition of several hundreds of times that is required in the ALD process may be smoothly performed.

The thin film deposition apparatus having the above rotating type structure may be more compactly manufactured in consideration of several matters.

Figure 4:
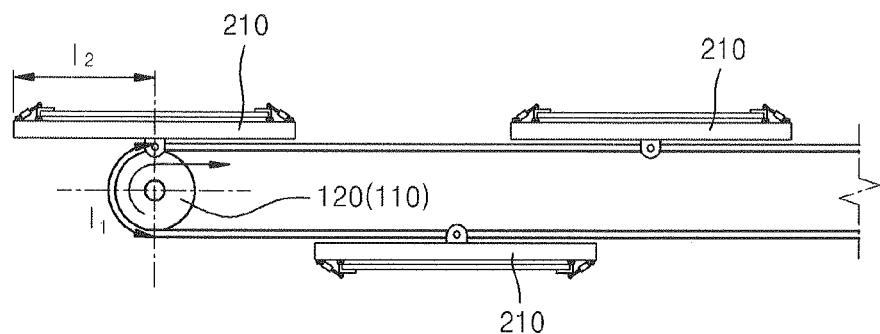
FIGS. 4 and 5 illustrate a relationship between $l_1$ and $l_2$ at which the size of thin film deposition apparatus illustrated in FIG. 1 may be reduced.

For example, as illustrated in FIG. 4, a length of a passage, where the proceeding direction of the support plate 210 is changed into the opposite direction, is $l_1$, which is a half of circumferential lengths of the driving pulley 110 and the driven pulley 120 of the thin film deposition apparatus illustrated in FIG. 1, and the length of passage $l_1$ may be substantially the same as a length $l_2$, which is a half of a length of the support plate 210 in the proceeding direction. Thus, the length of the support plate 210 in the proceeding direction and the circumferential lengths of the driving pulley 110 and the driven pulley 120 may be substantially the same. Then, a smooth direction change of the circulation track may be performed without forming the driving pulley 110 and the driven pulley 120 to have a large size.

Figure 5:
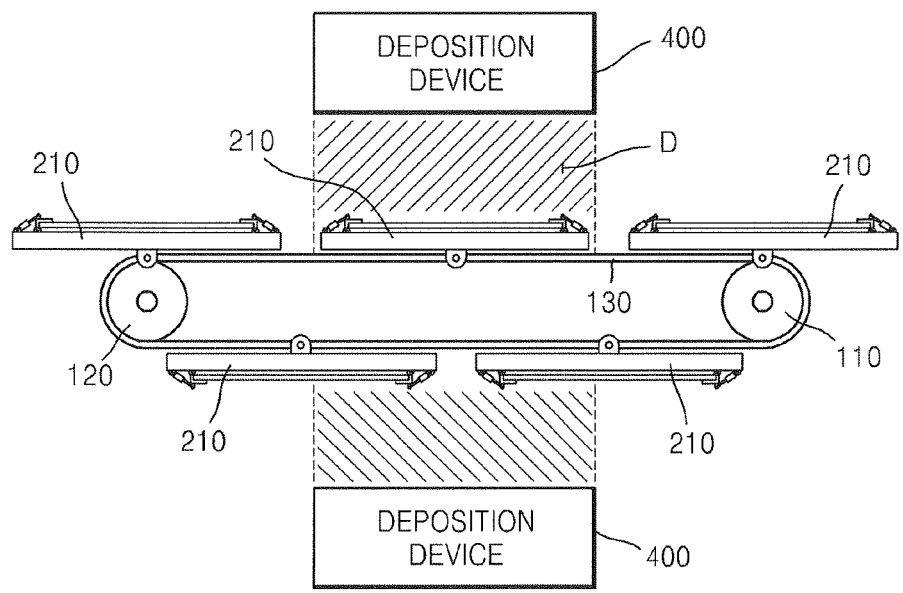

In addition, there may be five support plates 210, as illustrated in FIG. 5. Thus, when one of the support plates 210 passes through the deposition region D of the deposition device 400, another one of the support plates 210 is located at a position where the proceeding direction of the support plate 210 is changed into the opposite direction and the support plate 210 waits for entry into the deposition region D, and another one of the support plates 210 enters a passage where the support plate 210 changes its direction immediately after getting out of the deposition region D. Thus, an efficient and continuous process may be implemented. When a plurality of deposition devices 400 are disposed at both sides of the circulation track, as illustrated in FIG. 5, the deposition process may be more quickly performed.

Figure 6:
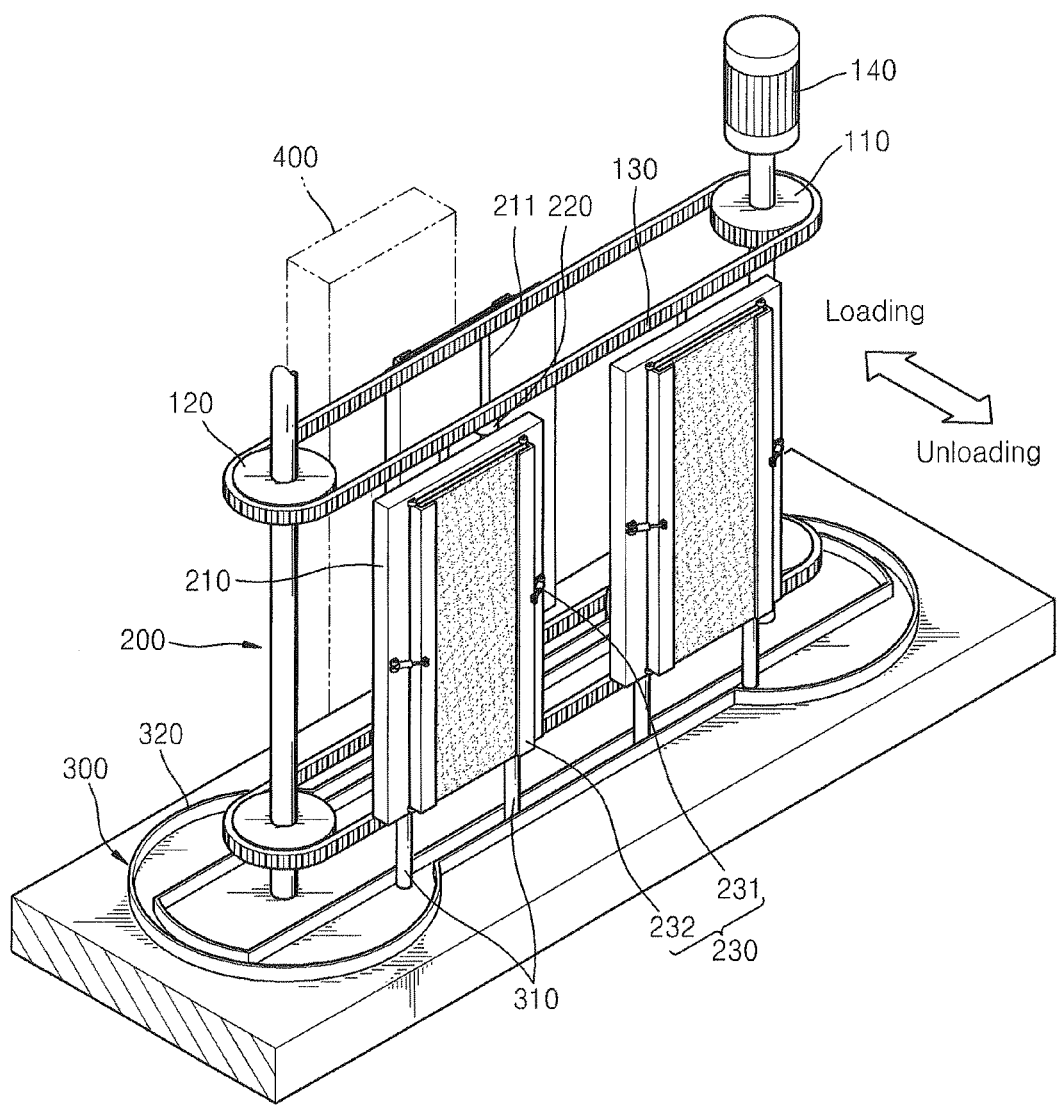
FIG. 6 is a perspective view of a structure of a thin film deposition apparatus according to another embodiment of the present invention.

Unlike the thin film deposition apparatus having a horizontal structure, as illustrated in FIG. 1 described above, the thin film deposition apparatus may have a vertical structure as illustrated in FIG. 6. That is, although in FIG. 1, the deposition target is laid in a horizontal direction and is moved, and in FIG. 6, a deposition target is laid in a vertical direction and is moved. Even in this case, since the clamping mechanism 230 of the support unit 200 fixes the substrate 10 and the mask 20 securely, stable deposition may be performed, like in FIG. 1.

As described above, in a thin film deposition apparatus of a rotating type according to the one or more embodiments of the present invention, thin layers may be precisely and uniformly formed on the entire surface of a deposition target, and since deposition is performed while a plurality of deposition targets are rotated along a caterpillar track, a working speed is faster compared to a general reciprocating motion method, and the size of the thin film deposition apparatus may be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film deposition apparatus comprising:
a deposition device;
a circulation running unit that moves a deposition target via a deposition region of the deposition device, the circulation running unit comprising:
a driving pulley that is rotated by a motor;
a driven pulley spaced apart from the driving pulley; and
a circulation belt coupling the driving pulley to the driven pulley, the circulation belt running over the driving pulley and the driven pulley; and
a support unit comprising:
a connection bar connected to the circulation belt; and
a support plate connected to the connection bar, the circulation belt moving the support plate along a direction, the support plate having a surface on which the deposition target is mounted, one side of the surface of the support plate being parallel to the moving direction of the support plate, a length of the one side of the surface of the support plate being the same as circumferential lengths of the driving pulley and the driven pulley to enable a smooth direction change of the circulation belt.

2. The thin film deposition apparatus of claim 1, wherein the support unit further comprises:
a clamping mechanism that fixes the deposition target to the support plate.

3. The thin film deposition apparatus of claim 2, wherein the clamping mechanism comprises:
a clamper that is rotatably installed on the support plate; and
an actuator that rotates and drives the clamper so that the clamper presses the deposition target towards the support plate to fix the deposition target to the support plate.

4. The thin film deposition apparatus of claim 1, wherein the support unit including five support plates connected to the circulation belt.

5. The thin film deposition apparatus of claim 1, further comprising a guide unit that prevents fluctuation of the deposition target while the support unit moves.

6. The thin film deposition apparatus of claim 5, wherein the guide unit comprises:
a guide rail that is disposed along the circulation belt; and
a plurality of guide protrusions connected to the support plate, the guide protrusion moving along the guide rail.

7. The thin film deposition apparatus of claim 1, wherein the surface of the support plate is laid horizontal with respect to ground while facing the deposition device.

8. The thin film deposition apparatus of claim 1, wherein the surface of the support plate is laid vertical with respect to ground while facing the deposition device.

9. The thin film deposition apparatus of claim 1 further comprising another deposition device, the deposition device being disposed on one side of the circulation belt, said another deposition device being disposed on an opposite side of the one side of the circulation belt.

10. A thin film deposition method comprising:
loading a deposition target on a support plate of a support unit, the support plate moving along a circulation belt of a circulation running unit that moves the deposition target via a deposition region of a deposition device, the circulation running unit comprising:
a driving pulley that is rotated by a motor;
a driven pulley spaced apart from the driving pulley; and
the circulation belt coupling the driving pulley to the driven pulley, the circulation belt running over the driving pulley and the driven pulley;
moving the deposition target along the circulation belt so that deposition is performed on the deposition target while passing the deposition region of the deposition device; and
unloading the deposition target, after deposition is completed, from the support plate, the support unit comprising:
a connection bar connected to the circulation belt; and
the support plate connected to the connection bar, the circulation belt moving the support plate along a direction, the support plate having a surface on which the deposition target is mounted, one side of the surface of the support plate being parallel to the moving direction of the support plate, a length of the one side of the surface of the support plate being the same as circumferential lengths of the driving pulley and the driven pulley to enable a smooth direction change of the circulation belt.

11. The thin film deposition method of claim 10, wherein the surface of the support plate is disposed in such a way that the deposition target is laid in a horizontal direction with respect to ground and runs along the circulation belt.

12. The thin film deposition method of claim 10, wherein the surface of the support plate is disposed in such a way that the deposition target is laid in a vertical direction with respect to ground and runs along the circulation belt.

13. The thin film deposition method of claim 10, wherein loading and unloading of the deposition target is performed at a position, at which the moving direction of the support plate is changed into an opposite direction along the circulation belt.

14. The thin film deposition method of claim 11, wherein the deposition device is disposed on one side of the circulation belt, another deposition device being disposed on an opposite side of the one side of the circulation belt.

* * * * *